United States Patent [19]

Sullivan et al.

[11] Patent Number: 4,707,620
[45] Date of Patent: Nov. 17, 1987

[54] ADJUSTABLE IMPEDANCE DRIVER NETWORK

[75] Inventors: Steven K. Sullivan; Christopher W. Branson, both of Beaverton, Oreg.

[73] Assignee: Tektronix, Inc., Beaverton, Oreg.

[21] Appl. No.: 887,314

[22] Filed: Jul. 22, 1986

[51] Int. Cl.⁴ .................... H03K 3/26; H03K 17/687; H03K 17/56
[52] U.S. Cl. .................................. 307/270; 307/243; 307/571; 333/124
[58] Field of Search ............... 307/270, 464, 242, 243, 307/571, 572; 333/124, 32

[56] References Cited

U.S. PATENT DOCUMENTS 3,646,329 2/1972 Yoshino et al. ............... 307/464
4,329,600 5/1982 Stewart ........................ 307/571

Primary Examiner—Stanley D. Miller
Assistant Examiner—B. P. Davis
Attorney, Agent, or Firm—William O. Geny; Robert S. Hulse

[57] ABSTRACT

A variable impedance driver network comprises a plurality of transmission gates connected in parallel between a voltage source and an output. Each transmission gate has a predetermined nominal impedance and by turning on selective gates the overall impedance of the network may be adjusted to match that required at the output.

7 Claims, 2 Drawing Figures

TRANSMISSION GATE

ADJUSTABLE IMPEDANCE DRIVER NETWORK

BACKGROUND OF THE INVENTION

The following invention relates to a variable impedance driver circuit for providing test signals from automatic test equipment in order to stimulate a device under test.

In driver circuits of the type used with automatic test equipment, it is often advantageous to use CMOS integrated chip technology to build the drivers needed to provide the test signal pulses used to stimulate a device under test because of the relative inexpensiveness and compact size of CMOS IC's. The device under test is usually connected to the driver output by a fixed impedance transmission line. Thus, in order to maintain the desired shape of the test pulses, it is necessary to match the output impedance of the driver circuit to the impedance of the transmission line.

One problem with such drivers, however, is that due to performance variations in the CMOS chips, the impedances of such drivers may vary considerably. It is not uncommon for the impedances of similar CMOS devices made by the same manufacturing process to vary as much as 100%. What is needed, therefore, in a test instrument using CMOS transmission gates as output drivers, is a way to match the impedance of each driver to the transmission line which is to be connected to the device under test.

SUMMARY OF THE INVENTION

The present invention provides a variable impedance driver network whose impedance can be matched to a transmission line or other connecting link between the test instrument and the device under test. The network comprises a plurality of gates, each having a predetermined nominal impedance. The gates are connected in parallel and may be selectively actuated by a control signal which may turn off or turn on preselected ones of the gates to achieve a desired overall impedance for the network.

The gates may be transmission gates utilizing a CMOS FET pair comprising an N channel device and a P channel device connected in parallel. Each gate has a predetermined nominal impedance, and the gates may be related in a binary sense such that for any given plurality of gates connected in parallel, the impedances may be R, 2R, ... $2^n$R, respectively. Each transmission gate may be controlled by a control line connected to a logic circuit which selectively actuates one or more of the gates in parallel. By turning on various ones of the gates and turning off others, the impedance of the network connecting a voltage source to the transmission line may be controlled.

It is a principal object of this invention to provide a compact, low cost variable impedance driver.

The foregoing and other objectives, features and advantages of the present invention will be more readily understood upon consideration of the following detailed description of the invention taken in conjunction with the accompanying drawings.

DETAILED DESCRIPTION OF THE INVENTION

Figure 1:
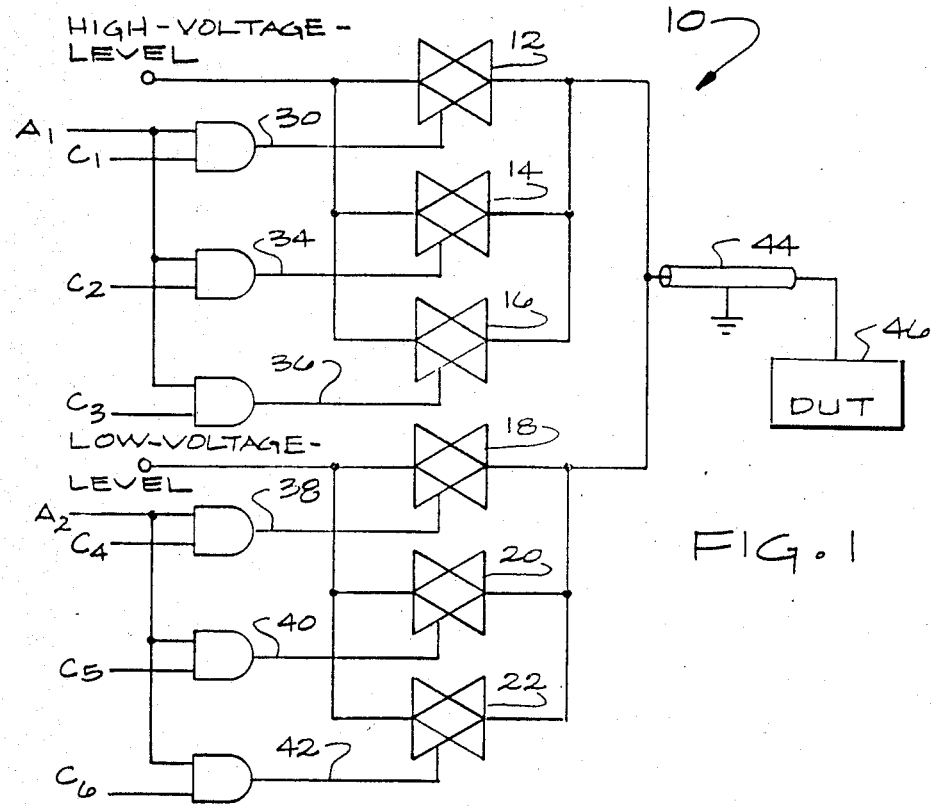
FIG. 1 is a block schematic diagram of a variable impedance driver network constructed according to the present invention.
Figure 2:
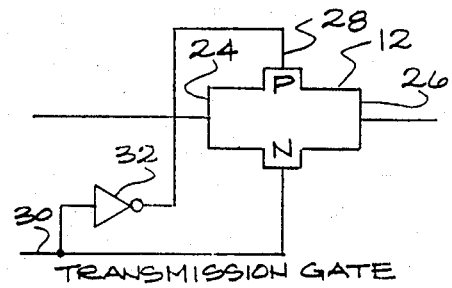
FIG. 2 is a schematic diagram of one of the transmission gates shown in FIG. 1.

A driver network 10 comprises a plurality of CMOS transmission gates 12, 14, 16, 18, 20 and 22. Referring to FIG. 2, which illustrates transmission gate 12, it can be seen that each of the gates 12, 14, 16, 18, 20 and 22 comprises a P channel transistor connected in parallel with an N channel transistor. Both transistors accordingly have a common source 24 and a common drain 26. The gate of the P channel transistor 28 is connected to control line 30 through inverting amplifier 32. Each of the transmission gates 12, 14, 16, 18, 20 and 22, respectively, are controlled by control lines 30, 34, 36, 38, 40 and 42, respectively. The state of each of the control lines 30, 34, 36, 38, 40 and 42 are controlled by coded input lines C1, C2, C3, C4, C5 and C6 in conjunction with lines A1 and A2 which control the state of the driver 10, that is whether it is to be in a high or low level logic state.

The output of the driver 10 is connected to a transmission line 44 which in turn may be connected to a device under test 46. By controlling various ones of the transmission gates 12, 14 and 16 in, for example, a high level logic state, one may choose the output impedance of the driver circuit 10. This is because each of the transmission gates 12, 14 and 16 has a predetermined nominal impedance when turned on and has a nearly infinite impedance when turned off. These nominal impedances are the stated impedances of the devices, that is, the ohmic values for which the gates 12, 14 and 16 are rated. In practice the actual impedances may be different from the stated impedances. Since, however, the gates are connected in parallel, the overall impedance changes, regardless of the actual individual impedance as more of the gates are turned on. Thus, given enough gates, the proper impedance may be produced by selectively enabling various combinations thereof, and this remains true despite the variation in actual impedance from the nominal impedance of each of the gates. When the appropriate impedance is achieved, a digital code is set which will repeatedly enable those gates in the network which were turned on when the proper impedance was found.

A finer degree of adjustment may be provided if the individual impedances of the transmission gates in their "on" states are binarily related. That is, if gate 12 has a resistance R, gate 14 would have a resistance 2R and gate 16 would have a resistance 4R. There may be more than three gates for the high and low logic levels respectively, and in such a case the values of the resistances would be R, 2R, ... $2^n$R, respectively. Thus, the high control line A1 or the low control line A2 controls whether the driver is in a high or a low logic states, and combinations of the control lines C1 through C3 for the high voltage level and C4 through C6 for the low voltage level control the output impedance of the driver 10 according to a digital code which selectively enables various ones of the transmission gates 12, 14, 16, 18, 20 and 22.

The terms and expressions which have been employed in the foregoing specification are used therein as terms of description and not of limitation, and there is no intention, in the use of such terms and expressions, of excluding equivalents of the features shown and described or portions thereof, it being recognized that the scope of the invention is defined and limited only by the claims which follow.

We claim:

1. A driver circuit having a high voltage output state and a low voltage output state and having a variable output impedance comprising:
   (a) a first plurality of transmission gates connected in parallel between a high voltage source and a transmission line;
   (b) a second plurality of transmission gates connected between a low voltage source and said transmission line; and
   (c) logic circuit means for simultaneously selectively enabling various ones of said gates when either a high level or low level actuating signal is provided to one of said respective pluralities of transmission gates, thereby adjusting the impedance between said high or low voltage source, respectively, and said transmission line.

2. The driver circuit of claim 1 wherein each transmission gate in each of said pluralities has a predetermined nominal impedance.

3. The driver circuit of claim 2 wherein in each of said pluralities of transmission gates, the individual transmission gates have nominal impedances of R, 2R, ... $2^n$R, respectively.

4. The driver circuit of claim 3 wherein the transmission gates are CMOS field effect transistors.

5. An adjustable impedance driver network for coupling a voltage source to an output, comprising:
   (a) a plurality of CMOS transmission gates, each gate in said plurality having a predetermined nominal impedance when turned on, and a substantially infinite impedance when turned off, connected in parallel between said voltage source and said output;
   (b) a voltage source coupled to each of said CMOS transmission gates; and
   (c) logic circuit means coupled to a control electrode of each of said transmission gates and responsive to both an actuating signal and a predetermined digital code, for selectively turning on various ones of said gates simultaneously to provide a variable impedance for said voltage source.

6. The adjustable impedance driver of claim 5 wherein said logic circuit means comprises an AND gate array, each AND gate in said array having an output connected to each respective control electrode and having respective inputs comprising said actuating signal and one bit of said digital code.

7. The adjustable impedance driver network of claim 6 wherein the nominal impedances of said gates are R, 2R, ... $2^n$R, respectively.

* * * * *